PROCESS FOR MASKED PLANAR DIFFUSIONS

Filed Jan. 3, 1968 3 Sheets-Sheet 1

INVENTORS B. G. COHEN
R. LILIENTHAL
BY Charles E. Graves
ATTORNEY

United States Patent Office 3,573,116

Patented Mar. 30, 1971

3,573,116

PROCESS FOR MASKED PLANAR DIFFUSIONS

Barry G. Cohen, Haifa, Israel, and Robert Lilienthal, Washington Township, Bergen, N.J., assignors to Bell Telephone Laboratories, Incorporated, Murray Hill, N.J.

Filed Jan. 3, 1968, Ser. No. 695,469
Int. Cl. H01l 7/34
U.S. Cl. 148—187 6 Claims

ABSTRACT OF THE DISCLOSURE

A process for masked planar diffusion of gallium into the unmasked portion of a bulk semiconductor is described in which the diffusion occurs in a completely water-free inert ambient such as nitrogen gas. A quartz box diffusion capsule is used with a conventional diffusion furnace in which the nitrogen circulates throughout the process.

This invention relates to diffused p-n junctions and more especially to a method and apparatus for achieving masked planar diffusions of gallium.

BACKGROUND OF THE INVENTION

In the preparation of p-n junctions by solid-state diffusion, impurities of one conductivity type are caused to diffuse into a bulk semiconductor of opposite conductivity type at controlled high temperatures and in a controlled atmosphere. The diffusion patterns are governed by deposited masks. In the case of silicon the masks are typically silicon dioxide, grown in an oxidizing ambient on the silicon. Masked diffusions rely on the fact that the diffusion constants of most impurity diffusants, such as boron or phosphorus are much greater in the bulk semiconductor than in the oxide mask. Boron is the almost universally employed p-type diffusant in silicon because of its high solid solubility as well as its negligible penetration of the oxide mask.

In certain siilcon applications, however, boron dopant has not proved satisfactory. For example, microwave oscillator diodes in which boron has been diffused frequently exhibit damage near the diffused p-n junction, stemming from the uncontrollably high boron concentration, and the misfit of boron in a silicon lattice. As a p-type diffusant in these devices and elsewhere, gallium would be preferred because of its lower solid solubility as well as its smaller effective diffusion coefficient and the reduced lattice strain per atom which it imposes. More generally, gallium as an acceptor diffusant offers in theory the advantages of controllable and lower surface concentrations, a lower diffusion constant for thin layers, less lattice damage for a given concentration and less reaction with other dopants in the silicon.

Gallium, however, does not readily lend itself to processes involving the silicon dioxide masking of a p-type impurity. Heretofore, for example, silicon dioxide masks have been ineffective as barriers against gallium diffusions from oxide sources in conventional atmospheres. Moreover, conventional gallium diffusions into silicon often result in severe surface erosion and damage to the unprotected bulk surface.

Accordingly, one object of this invention is to make controlled masked gallium diffusions into bulk semiconductors.

Another object of the invention is to make gallium more available as a p-type impurity for use in planar diffusions.

A further object of the invention is to improve microwave oscillator silicon diodes.

SUMMARY OF THE INVENTION

The invention is grounded in part upon the discovery that a completely dry oxide mask will, in a mildly reducing atmosphere and under certain controlled conditions, present an impervious barrier to a gallium diffusant.

In a typical procedure for practicing the invention, an n-doped silicon wafer with regions masked by a grown $SiO_2$ layer is subjected to a temperature of about 1150° C. in a dried nitrogen atmosphere and in the presence of an oxide source of gallium, such as gallium sesquioxide ($Ga_2O_3$). The dryness of the nitrogen corresponds to less than 5 parts per million of water vapor. This atmosphere is slightly reducing to the source material, yet still capable of growing a thin oxide on the exposed silicon surface. This oxide contains a considerable quantity of gallium for delivery to the silicon surface. Depending upon the process time, the gallium planarly diffused into the silicon will produce sheet resistances of about $10^3$–$10^6$ ohm/square, with junction depths of from 0.3 to 8.2 microns. Importantly, no discernible surface damage or erosion occurs.

Gallium doped p-type layers produced in accordance with the teachings of the invention are significantly less susceptible to structural damage for a given dopant concentration. Moreover, less severe reaction problems occur when, for example, phosphorus-doped emitters are diffused into gallium as opposed to boron.

One feature of the invention is the use of a completely dry and only slightly reducing ambient in carrying out the diffusion of gallium into a bulk semi-conductor.

Another feature of the invention resides in the use of silicon dioxide masking of a silicon wafer in conjunction with a dry, slightly reducing atmosphere and an oxide source of acceptor diffusant.

A detailed understanding of the invention, its further objects, features and advantages may be gained from the description to follow of an illustrative embodiment thereof.

DETAILED DESCRIPTION OF THE INVENTION

Figure 1:
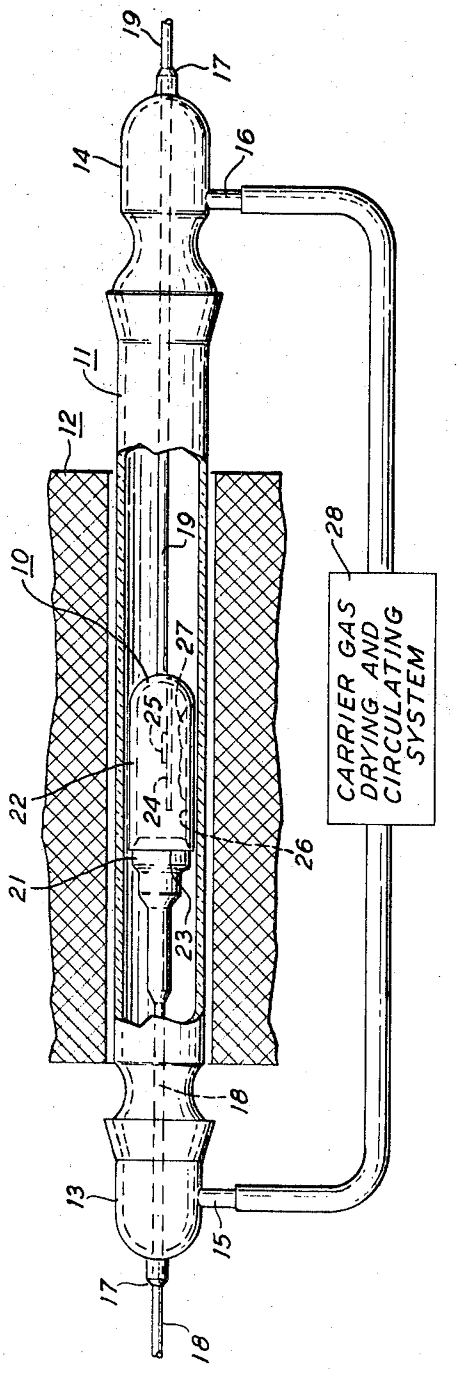
FIG. 1 is a schematic sectional diagram of apparatus used to carry out the inventive process.
Figure 2:
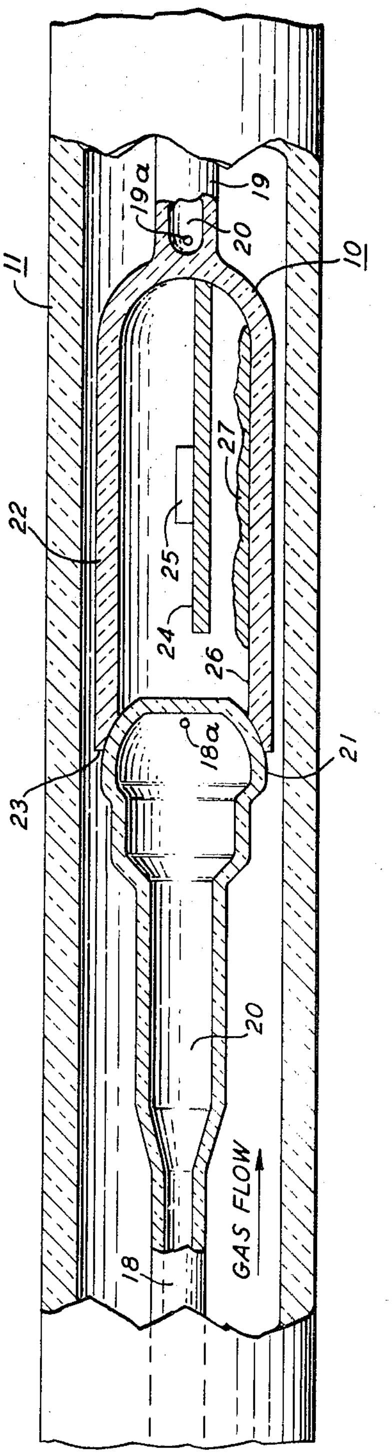
FIG. 2 shows in fragmented sectional a "quartz box" used in practicing the invention.

The inventive process may be carried out by the apparatus depicted in FIGS. 1 and 2. The basic elements are a "quartz box" designated generally as 10, a surrounding gas envelope defined by an elongated open-ended quartz tube 11 and a conventional diffusion furnace 12 surrounding tube 11. The tube caps 13, 14 seal onto the open ends of tube 11 as shown schematically in FIG. 1. Caps 13, 14 include ducts 15, 16, respectively to circulate an atmosphere, as will be described. Seals 17 through the crowns of caps 13, 14 accommodate two pushrods 18, 19, which are made of quartz. Push rod 18 terminates in a fixed ball point 21 that is gastight. Similarly, pushrod 19 is affixed to a movable capsule 22 having a ground concave face 23 that can sealably engage the ball joint 21 in a gastight fit. The hollow spaces 20 in pushrods 18, 19 are to advantageously allow the insertion of thermocouples 18_a_, 19_a_, for temperature monitoring purposes. A spectrosil plate 24 cantilevered within capsule 22 serves as a platform for supporting a charge 25.

Charge 25 comprises masked and, where desired for control purposes, unmasked silicon wafers as will be described below.

The inner floor 26 of capsule 22 supports the material selected as a source 27 of gallium, the source in this instance being $Ga_2O_3$. Suitable connections are made from ducts 15, 16 to a dry nitrogen closed circulating system designated 28. In this system conventional means (not shown) are included for drying the nitrogen, as for example, passing line nitrogen through a copper coil immersed in a methanol Dry Ice bath which has a temperature of $-80°$ C.

The nitrogen serves as an inert atmosphere in the furnace. As earlier noted, this atmosphere is slightly reducing to the source material, but still capable of growing a thin oxide on an exposed silicon surface. The slightly reducing characteristic of this atmosphere is due to the fact that the vapor pressure of oxygen in the gas, due to minute traces of residual water vapor therein, is lower than the vapor pressure of oxygen over the $Ga_2O_3$ but higher than oxygen over unoxidized silicon.

EXAMPLE 1

An ingot comprised of phosphorus doped float zone silicon oriented in the 1:1:1 direction and having an average resistivity of 5.0 ohm-cm. ($1\times10^{15}$ donors/cc.) was sliced, lapped, polished and diced into ¼″ squares using conventional laboratory processes. On some of the squares, oxides of about 8000 A. thickness were grown on the chemically polished surfaces through exposure to steam for 2 hours. Five mil diameter openings were made by standard photoresist techniques in the oxide, exposing the clean silicon surface. Other ¼″ squares without any oxides were prepared as controls using standard cleaning techniques.

The silicon squares, one of each type were laid on the spectrosil plate and the $Ga_2O_3$ source placed into the capsule 22. Tube caps 13, 14 were emplaced and the circulation of dry nitrogen was begun. The capsule advantageously is flushed at the furnace mouth for about 5 minutes at approximately 100° C. to completely dry the source and to provide a dry nitrogen atmosphere in the capsule in place of air. The quartz box was then closed by inserting the capsule 22 into the furnace hot zone for sealable mating with the ball joint 21.

The oxide source and the silicon wafers, charge 25, were maintained at the same temperature, 1150° C. as monitored at both ends of the box with Pt-Pt 10% Rh thermocouples **18*a*, 19*a***. The dry nitrogen was circulated at a flow rate of about 150 cc./min. The capsule was exposed in the furnace for approximately 64 hours. At the conclusion, the capsule was withdrawn to the end of the furnace tube and allowed to cool to less than 100° C. before the wafers were removed. (To avoid contaminating the oxide source with moisture the capsule was reinserted into the system, flushed, and maintained at a temperature above 100° C.)

A thin transparent oxide of approximately 400 A. thickness was present on the surface of the unmasked control square. After removal of this oxide in concentrated HF, sheet resistance measured approximately 1170 ohm/square. Junction depth, obtained through angle lapping, staining and measuring with a monochromatic light source was 8.25 micron. No visible surface damage was observed. Similarly, no surface damage or erosion occurred to the unmasked areas of the oxide-masked square. The gallium diffused into the exposed silicon surface to the same extent as with the control square but no gallium diffusant was detected under the mask.

EXAMPLE 2

Wafers were prepared as in Example 1, inserted into the furnace and maintained at a temperature of 1175° C. for a period of 16 hours. Measurements at the conclusion of the run showed a junction depth of 5.0 microns and a DC sheet resistance of 1670 ohm/square.

Figure 3:
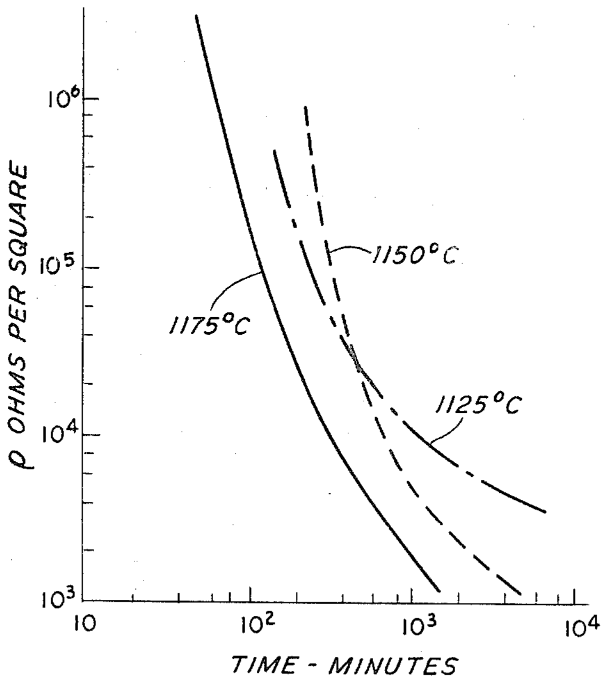
FIG. 3 is a graph showing process time vs. sheet resistivity for various temperatures.
Figure 4:
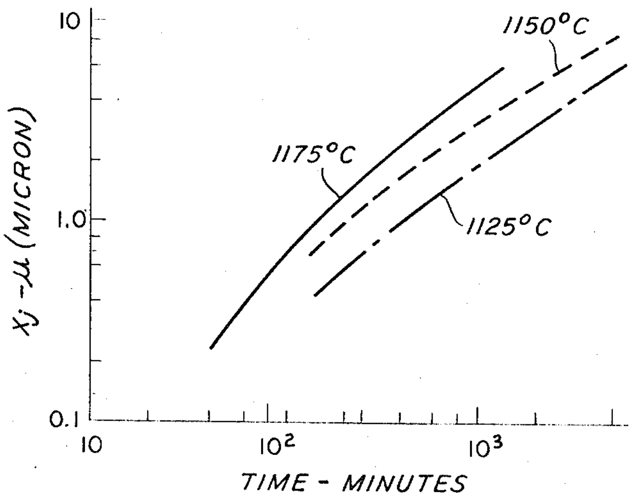
FIG. 4 is a graph showing process time vs. junction depth for various temperatures.
Figure 5:
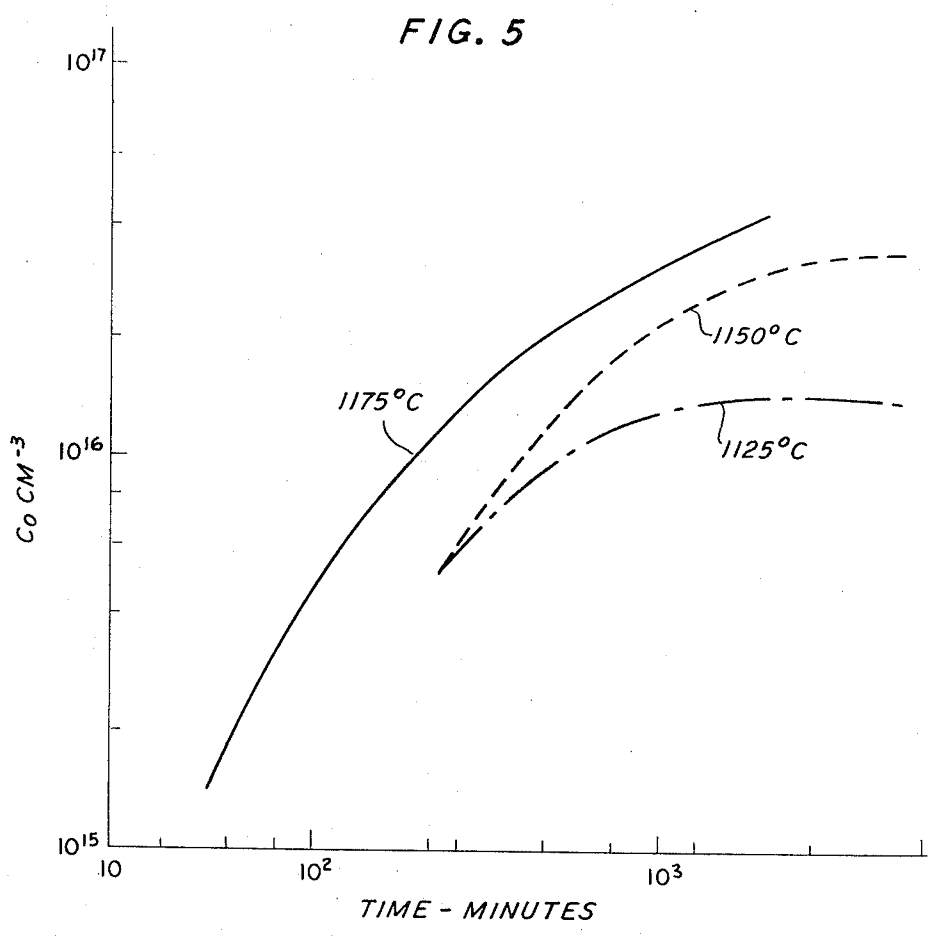
FIG. 5 is a graph showing process time vs. $C_0$ for various temperatures.

Several further runs were made with similarly successful results. FIG. 3 graphs the sheet resistivity of the silicon surface exposed to the gallium diffusion, as a function of time and temperature. FIG. 4 depicts the junction depths as a function of time and temperature. FIG. 5 is a plot of $C_o$, the surface concentration of the gallium diffusant, based upon an assumed linear impurity profile. From this plot it is seen that a temperature of 1125° C. or higher is required for higher gallium concentrations. At 1125° C. the gallium concentration reaches a level plateau of $1.5\times10^{16}$ cm.$^{-3}$. At various temperatures, obtainable surface concentrations are in the range of $10^{15}$ to $10^{17}$ cm.$^{-3}$.

The water vapor content of the inert ambient is advantageously reduced by drying of the gas to a dewpoint below $-80°$ C. The residual vapor content thereafter corresponds to less than 5 parts per million. A water vapor content substantially above this is deleterious to the process, while a content below this does not enhance the process. A suitably dried argon atmosphere would also provide a favorable inert ambient.

Although the diffusion depth is unlimited, there is a limit to the surface concentration $C_o$, this being in the neighborhood of $10^{17}$ acceptors/cm.$^3$. The process as illustrated is particularly useful, therefore, whenever it is desired to obtain a low concentration controllable depth diffusion. A different source selected for a higher gallium species vapor pressure would yield a higher $C_o$. In contrast, it has been difficult to achieve with boron a low concentration p-type diffusion. One reason is that boron was a very high solubility and is readily transferred from a source to the silicon.

Tests were made to determine the effects of the addition of small quantities of activants such as oxygen, hydrogen or water vapor to the carrier gas. With the addition of $>10\%$ dry oxygen the wafers did not convert but grew a thick oxide. The addition of minute amounts of dry hydrogen ($\approx0.2\%$) causes diffusion through the oxide mask, and in some cases gallium metal was deposited on the wafers. A small amount of water vapor appears to slow down the diffusion and increases $\rho_s$, but the ability of the oxide to mask was not affected.

Using conventional techniques, diodes were constructed from the masked squares produced in accordance with the inventive diffusion process. These diodes were of the hyperabrupt type for use as Read oscillators, further information on which is found in W. T. Read, Jr. Pat. 2,899,646, issued Aug. 11, 1959, and assigned to applicants' assignee. Their V–I characteristics were examined. The observed junction breakdowns appeared typical of the bulk material. In practical terms, this means that the diffusion of Ga to form the p-n junction was not accompanied by damage or distortion of the silicon.

Importantly, a very useful control of sheet resistance junction depth and/or surface concentration can be attained in accordance with the process of the invention. Sheet resistances can be obtained in a range much higher, and surface concentrations in a range much lower, than those obtainable with boron. The regions in which the gallium diffusions made possible by the present invention are effective are the regions where boron is ineffective.

Other choices of source materials, for diffusion into silicon or other semiconductors, are readily envisionable. Their suitability would be governed by whether the partial pressure of the dopant species, in the selected dry ambient, is sufficiently high to transfer the dopant to the semiconductor material, but not so high as to be uncontrollable. For inorganic dopants, such compounds as $Ga_2O$ or suitable halides such as $GaF_3$ or $AlCl_3$ may be envisioned. In addition the class of metal-organic compounds, such as tri-methyl aluminum or tri-ethyl gallium, may be usable at considerably lower temperatures.

In summary, the described diffusion technique makes possible the use of gallium-doped p-type layers in all planar devices including transistors and microwave diodes. High resistance layers are easily achieved. Advantages to be expected from making, for example, transistor base layers by gallium rather than boron diffusion includes lessened structural damage for a given dopant concentration. Also, when layers require only a light doping, it is possible to secure a finer measure of parameter control with the inventive process hereinabove described.

It is to be understood that the embodiments described herein are merely illustrative of the principles of the invention. Various modifications may be made thereto by persons skilled in the art without departing from the spirit and scope of the invention.

What is claimed is:

1. A process for achieving masked planar diffusion of gallium into an n-doped silicon wafer, comprising the steps of growing a silicon oxide mask on said wafer, and then subjecting the wafer to a temperature in the range of 1125–1175° C. in an inert ambient predried to a water vapor content of approximately 5 parts per million and in the presence of gallium oxide.

2. A process in accordance with claim 1 wherein said inert ambient is nitrogen.

3. A process in accordance with claim 1 wherein said gallium oxide is $Ga_2O_3$.

4. A process for masked diffusion of gallium into a bulk semiconductor comprising the steps of growing a silicon dioxide layer on a surface of the semiconductor, exposing selected areas of said surface, and confining the semiconductor with a $Ga_2O_3$ source in a dry nitrogen atmosphere at 1125–1175° C. for a preselected time.

5. A process for achieving masked planar diffusion of a p-type impurity into n-type silicon comprising the step of confining at elevated temperatures a silicon semiconductive specimen masked with silicon oxide, with $Ga_2O_3$ in the presence of an inert ambient selected from the group consisting of nitrogen and argon and dried to a water-vapor content of approximately 5 parts per million.

6. A process pursuant to claim 4 wherein said confining occurs within a temperature range of 1125–1175 degrees C. for a period of from 2 to 60 hours.

References Cited

UNITED STATES PATENTS

| | | | |
|---|---|---|---|
| 2,802,760 | 8/1957 | Derick et al. | 148—187 |
| 3,131,099 | 4/1964 | Constantakes | 148—189 |
| 3,215,570 | 11/1965 | Andrews et al. | 148—188 |
| 3,314,833 | 4/1967 | Arndt et al. | 148—189 |
| 3,408,238 | 10/1968 | Sanders | 148—187 |

HYLAND BIZOT, Primary Examiner

R. A. LESTER, Assistant Examiner

U.S. Cl. X.R.

148—188, 189, 190